US010663531B2

(12) United States Patent
Zhu et al.

(10) Patent No.: US 10,663,531 B2
(45) Date of Patent: May 26, 2020

(54) DIGITAL SHORT DETECTION METHOD OF CLASS D AMPLIFIER

(71) Applicant: Cirrus Logic International Semiconductor Ltd., Edinburgh (GB)

(72) Inventors: Lei Zhu, Austin, TX (US); Jing Bai, Austin, TX (US); Xiaofan Fei, Austin, TX (US); Xin Zhao, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 48 days.

(21) Appl. No.: 16/156,069

(22) Filed: Oct. 10, 2018

(65) Prior Publication Data

US 2019/0107570 A1    Apr. 11, 2019

Related U.S. Application Data

(60) Provisional application No. 62/570,860, filed on Oct. 11, 2017.

(51) Int. Cl.
*G01R 31/50* (2020.01)
*H03F 3/217* (2006.01)

(52) U.S. Cl.
CPC ............ *G01R 31/50* (2020.01); *H03F 3/217* (2013.01)

(58) Field of Classification Search
CPC .............................. G01R 31/50; H03F 3/217
USPC ............................................................ 330/2
See application file for complete search history.

(56) References Cited

U.S. PATENT DOCUMENTS

| 5,945,802 | A | * | 8/1999 | Konrad | ................ | G01R 31/343 318/807 |
| 5,973,569 | A | | 10/1999 | Nguyen | | |
| 6,229,389 | B1 | * | 5/2001 | Pullen | ..................... | H03F 1/523 330/10 |
| 7,701,287 | B2 | | 4/2010 | Cheng et al. | | |
| 8,749,303 | B2 | | 6/2014 | Amadi et al. | | |
| 2005/0152561 | A1 | * | 7/2005 | Spencer | ................ | H03F 3/2171 381/77 |
| 2007/0236286 | A1 | * | 10/2007 | Kobayashi | ................ | H03F 1/52 330/10 |
| 2009/0097178 | A1 | * | 4/2009 | Krishnan | ................ | H03F 1/523 361/86 |
| 2009/0302858 | A1 | * | 12/2009 | Kulkarni | ................ | B60Q 1/305 324/504 |

(Continued)

*Primary Examiner* — Patricia T Nguyen
(74) *Attorney, Agent, or Firm* — E. Alan Davis; James W. Huffman

(57) ABSTRACT

An apparatus detects a short of a class-D amplifier. A pulse detector detects an output PWM pulse exceeds a predetermined width and a controller differentiates whether the pulse width exceeding is caused by a short or by a large digital input signal occurring during normal operation based on an expected level of the digital input signal to a level of the digital input signal when the pulse width exceeds the predetermined width. The expected level is dynamically obtained in response to one or more previous PWM pulses exceeding the predetermined width during the normal operation and may be selected based on an amount the pulse exceeds the predetermined width. A lookup table of predetermined levels, selected based on impedance of a load, provides the expected level if the expected level has not yet been dynamically obtained when the pulse width exceeds.

20 Claims, 4 Drawing Sheets

(56) References Cited

U.S. PATENT DOCUMENTS

2010/0019775 A1* 1/2010 Ikejiri .................... G01R 31/50
                                                        324/537
2013/0049763 A1* 2/2013 Jiang ...................... H02M 1/32
                                                        324/509

* cited by examiner

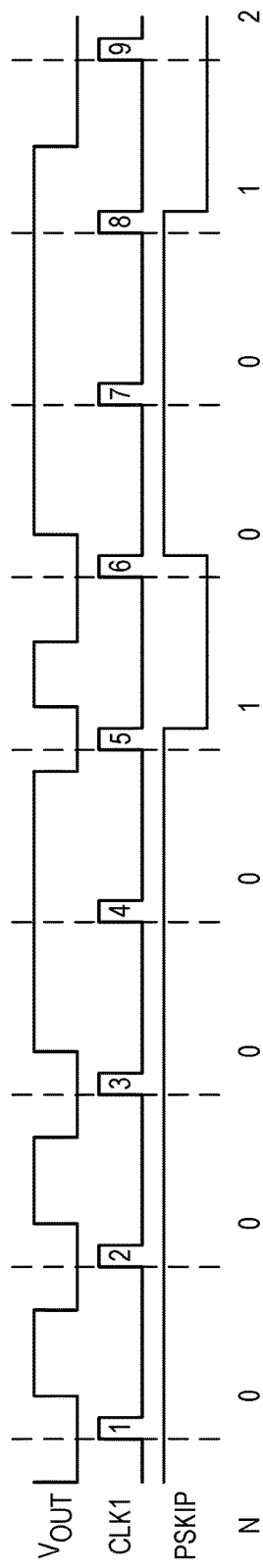

DIGITAL SHORT DETECTION METHOD OF CLASS D AMPLIFIER

CROSS REFERENCE TO RELATED APPLICATION(S)

This application claims priority based on U.S. Provisional Application, Ser. No. 62/570,860, filed Oct. 11, 2017, entitled Digital Short Detection Method of Class D Amplifier, which is hereby incorporated by reference in its entirety.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation (PWM), pulse-density modulation (PDM), or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers. Typically, a PWM amplifier is chosen in order to provide accurate load voltage with desirable Total Harmonic Distortion (THD) and Power Supply Rejection Ratio (PSRR).

Generally speaking, an audio amplifier is used to drive a heavy load through output pins that are exposed, which may result in a short circuit in the load (e.g., personal audio device is dropped in water or a malfunction of headphones plugged into the personal audio device). When there is a short circuit, damage may occur to the driver stage of the amplifier if it is without protection. Recently, a need has arisen to compare a short load threshold impedance that is much closer to a normal operation load impedance.

Conventional solutions require additional power, area, and circuit complexity just to detect a very low impedance short. A need for more accurate and less complex short detection in the audio amplifier is desired. Conventional solutions include serial detection, which involves adding in series an accurate resistor and measuring the voltage across the resistor. Conventional solutions also include parallel current detection and digital detection. An example parallel current detection is accomplished and provided by U.S. Pat. No. 5,973,569 which mirrors and scales output stage current and compares to a reference. An example parallel voltage detection is accomplished and provided by U.S. Pat. No. 7,701,287 which samples output voltage and compares it to a reference. An example digital detection is performed and provided by U.S. Pat. No. 8,749,303 which detects a short circuit when a class-D amplifier output pulse is skipped; however, it assumes the PWM pulse is never skipped during normal operation of the class-D amplifier. More specifically, U.S. Pat. No. 8,749,303 does not address a design in which the output PWM period varies as the input power signal changes.

SUMMARY

In one embodiment, the present disclosure provides an apparatus for detecting a short at an output of a class-D amplifier. The apparatus includes a pulse detector that detects that a pulse-width modulation (PWM) pulse of the output exceeds a predetermined width and a controller configured to differentiate whether the PWM pulse exceeding the predetermined width is caused by a short at the output or by a large digital input signal occurring during normal operation of the class-D amplifier. The controller differentiates based on an expected level of the digital input signal and a level of the digital input signal when the PWM pulse is detected to exceed the predetermined width.

In another embodiment, the present disclosure provides a method for detecting a short at an output of a class-D amplifier. The method includes detecting that a pulse-width modulation (PWM) pulse of the output exceeds a predetermined width and differentiating whether the PWM pulse exceeding the predetermined width is caused by a short at the output or by a large digital input signal occurring during normal operation of the class-D amplifier. The differentiating is based on an expected level of the digital input signal and a level of the digital input signal when the PWM pulse is detected to exceed the predetermined width.

In yet another embodiment, the present disclosure provides a non-transitory computer-readable medium having instructions stored thereon that are capable of causing or configuring an apparatus for detecting a short at an output of a class-D amplifier to perform operations comprising detecting that a pulse-width modulation (PWM) pulse of the output exceeds a predetermined width and differentiating whether the PWM pulse exceeding the predetermined width is caused by a short at the output or by a large digital input signal occurring during normal operation of the class-D amplifier. The differentiating is based on an expected level of the digital input signal and a level of the digital input signal when the PWM pulse is detected to exceed the predetermined width.

BRIEF DESCRIPTION OF THE DRAWINGS

FIG. 6 is an example timing diagram illustrating operation of the analog pulse detect counter of FIG. 5.

FIGS. 7A and 7B are example block diagrams illustrating two embodiments of the short threshold load lookup table of FIG. 4.

FIG. 8 is an example block diagram illustrating an embodiment of the tracking table of FIG. 4.

DETAILED DESCRIPTION

Figure 1:
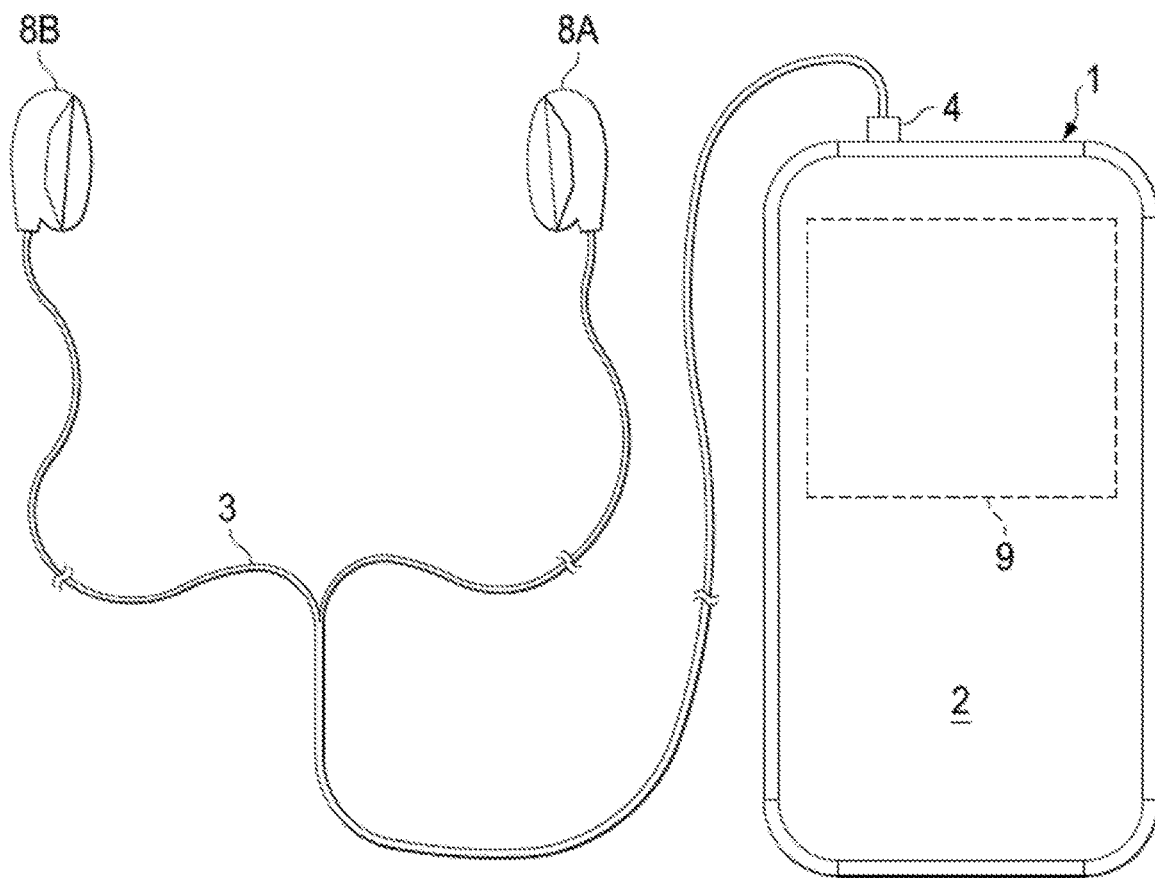
FIG. 1 is an illustration of an example personal audio device.

Referring now to FIG. 1, an illustration of an example personal audio device 1, in accordance with embodiments of the present disclosure is shown. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
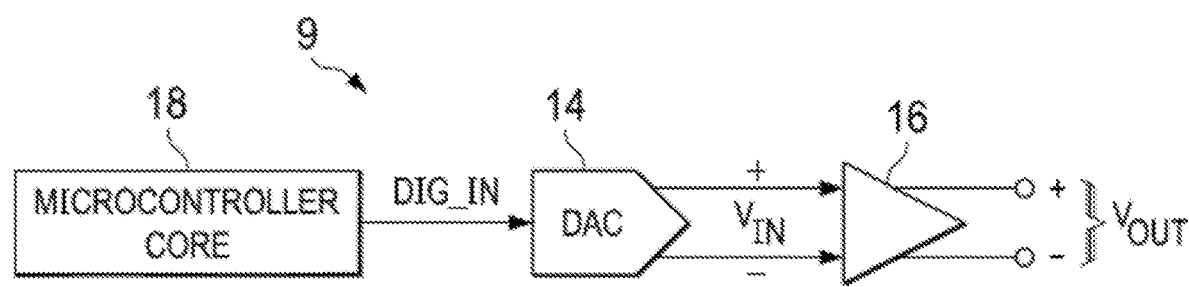
FIG. 2 is a block diagram of selected components of an example audio IC of a personal audio device.

Referring now to FIG. 2, a block diagram of selected components of an example audio IC 9 of a personal audio device, in accordance with embodiments of the present disclosure is shown. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output. The microcontroller 18 may perform various functions described herein associated with the detection of a short condition in the amplifier 16.

Figure 3:
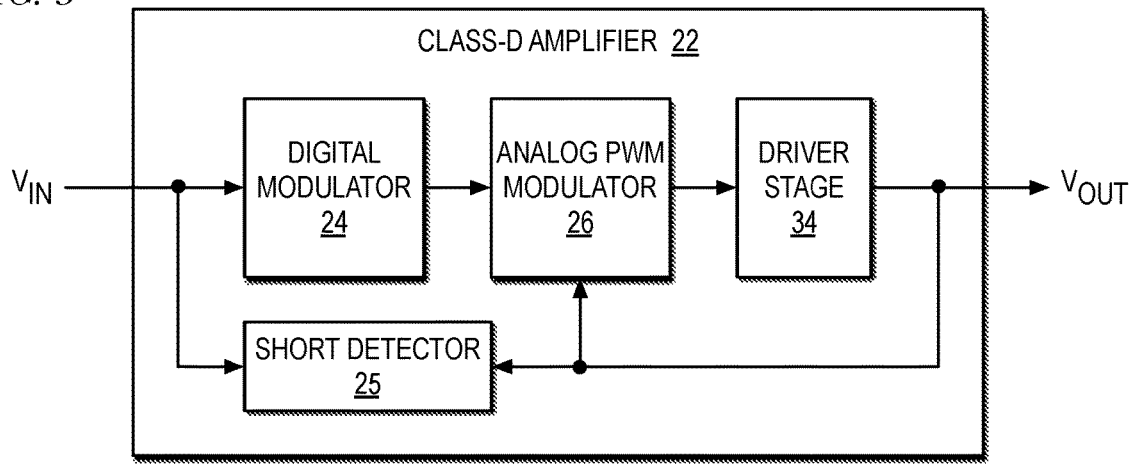
FIG. 3 is a block diagram of selected components of an example class-D amplifier.

Referring now to FIG. 3, a block diagram of selected components of an example class-D amplifier 22, in accordance with embodiments of the present disclosure is shown. Preferably, class-D amplifier 22 is a PWM amplifier. In some embodiments, example class-D amplifier 22 may be used to implement amplifier 16 of FIG. 2. As shown in FIG. 3, example class-D amplifier 22 may include a digital modulator subsystem 24 and an analog PWM modulator 26. In one embodiment, the digital modulator subsystem 24 is a digital closed-loop PWM modulator (DCL_PWMM).

The class-D amplifier 22 may be configured to operate in an analog closed-loop mode through the use of analog PWM modulator 26. In the analog closed-loop mode, input signal $V_{IN}$ may be modulated by digital modulator 24, analog PWM modulator 26 may receive its input from digital modulator 24, and analog PWM modulator 26 may be utilized such that the output of analog PWM modulator 26, as received and driven by driver stage 34, is driven as output signal $V_{OUT}$. Driver stage 34 may comprise a plurality of output switches configured to generate output signal $V_{OUT}$ from a modulated signal generated by analog PWM modulator 26. At nominal/quiescent levels of the input signal $V_{IN}$, the period of the PWM output signal $V_{OUT}$ has a period of a sample clock CLK1 employed by an analog pulse detect counter 404 described below with respect to FIGS. 4 and 5. However, the amplifier 22 may increase the period of the PWM output signal $V_{OUT}$ under certain conditions, e.g., when the input signal $V_{IN}$ level is high. Additionally, in the presence of a short condition, it is unlikely the amplifier 22 will be able to drive the output $V_{OUT}$ to its intended levels (e.g., 4V and ground). Consequently, the amplifier 22 will sense this condition via the feedback loop and attempt to provide the intended amount of energy by widening the PWM pulses on the output $V_{OUT}$.

Figure 4:
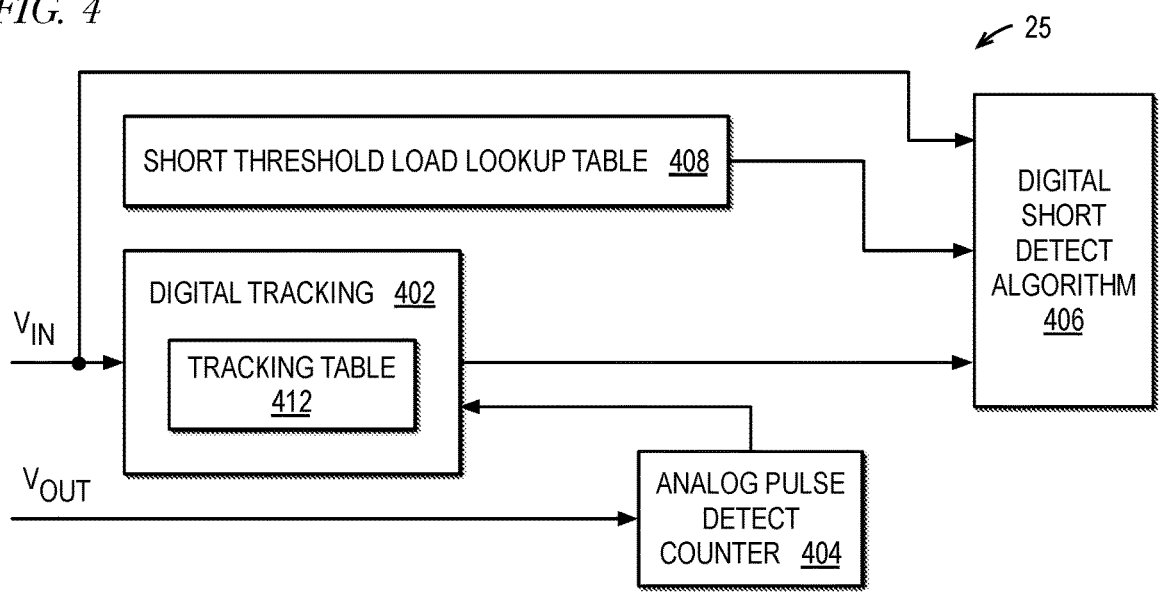
FIG. 4 is a block diagram illustrating an embodiment of the short detector of FIG. 3.

Referring now to FIG. 4, a block diagram illustrating in an embodiment of the short detector 25 of FIG. 3 is shown. The short detector 25 includes a digital tracking block 402, an analog pulse detect counter 404, a digital short detect algorithm block 406 and a short threshold load lookup table 408. The digital tracking block 402 includes a tracking table 412. The digital tracking block 402 and the digital short detect algorithm block 406 each receives the input signal $V_{IN}$. The analog pulse detect counter 404 receives the output signal $V_{OUT}$. The analog pulse detect counter 404 monitors the output signal $V_{OUT}$ every sample clock to detect skipped pulses and provides a count of the number of skipped pulses in the output signal $V_{OUT}$ to the digital tracking block 402. An embodiment of the analog pulse detect counter 404 is described in more detail below with respect to FIG. 5. The presence of skipped pulses may indicate the presence of a short condition, as described in more detail. A skipped pulse occurs when the width of a PWM pulse at the output signal $V_{OUT}$ exceeds a predetermined width, e.g., the sample clock period. If the width of the PWM pulse exceeds the predetermined width by multiples of the predetermined width, the analog pulse detect counter 404 will detect multiple skipped pulses. Advantageously, embodiments are described in which the digital short detect algorithm block 406, when the analog pulse detect counter 404 detects one or more skipped pulses, distinguishes between a true short condition and a normal operation condition in which the digital input signal $V_{IN}$ is large causing the amplifier 22 to generate one or more PWM pulses with large widths (e.g., exceeding the sample clock period) that are detected by the analog pulse detect counter 404 as skipped pulses. The digital short detect algorithm block 406 may make the distinction based on a comparison of the present level of the input signal $V_{IN}$ and an expected level of the input signal $V_{IN}$ associated with the observed number of skipped pulses. The expected level of the input signal $V_{IN}$ may be provided by the tracking table 412 that is dynamically populated by the digital tracking block 402 with a history of input signal $V_{IN}$ levels for different numbers of pulses skipped during normal operation of the amplifier 22. Alternatively, the expected level of the input signal $V_{IN}$ may be provided by the short threshold load lookup table 408 when the tracking table 412 entry associated with the detected number of skipped pulses has not yet been populated, as described in more detail below. In one embodiment, the microcontroller 18 of FIG. 2 performs one or more of the functions of the digital tracking block 402 and the digital short detect algorithm block 406, and the short threshold load lookup table 408 may be stored in a memory accessible by the microcontroller 18.

Figure 5:
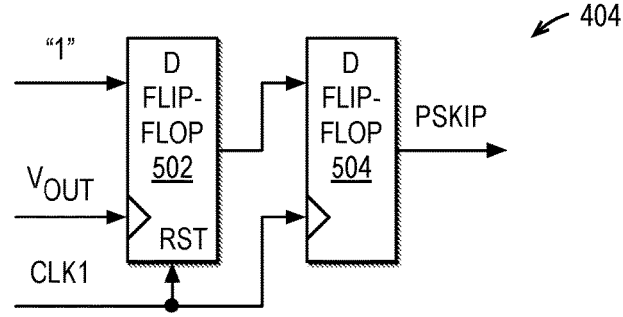
FIG. 5 is a block diagram illustrating an example embodiment of the analog pulse detect counter of FIG. 4.

Referring now to FIG. 5, a block diagram illustrating an example embodiment of the analog pulse detect counter 404 of FIG. 4 is shown. The analog pulse detect counter 404 includes a first D-flip flop 502 and a second D-flip flop 504.

The data input of the first D flip-flop 502 receives a logical one value. The clock input of the first D flip-flop 502 receives the output signal $V_{OUT}$. The reset input of the first D flip-flop 502 receives the sampling clock CLK1. The period of CLK1 is the period of the PWM output signal $V_{OUT}$ when the input signal $V_{IN}$ is at its nominal/quiescent level. The data input of the second D flip-flop 504 receives the Q output of the first D flip-flop 502. The clock input of the second D flip-flop 504 receives the sampling clock CLK1. The Q output of the second D flip-flop 504 is a signal PSKIP. In the embodiment of FIG. 5, a deasserted value of PSKIP at the CLK1 pulse indicates a skipped pulse at the PWM output signal $V_{OUT}$. The serial nature of the first D flip-flop 502 and the second D flip-flop 504 ensure the output PSKIP of the analog pulse detect counter 404 is glitch free. The analog pulse detect counter 404 sends a digital output PSKIP for every sampling clock cycle to the short detect algorithm block 406 via the digital tracking block 402 once the system is powered on. Operation of the analog pulse detect counter 404 is described below with respect to FIG. 6.

Referring now to FIG. 6, an example timing diagram illustrating operation of the analog pulse detect counter 404 of FIG. 5 is shown. The sampling clock CLK1 starts at the beginning of the period of the PWM output signal $V_{OUT}$. The period of the PWM output signal $V_{OUT}$ may vary based on the level of the digital input signal $V_{IN}$. The value of the output PSKIP of the analog pulse detect counter 404 is also shown, as well as the number of skipped pulses N. Nine pulses of the sampling clock CLK1 are shown. As shown, in clock period 4, the width of the PWM output signal $V_{OUT}$ exceeds the predetermined width of the period of the sampling clock CLK1. Responsively, the analog pulse detect counter 404 de-asserts PSKIP in period 5 of the sampling clock CLK1 to indicate a skipped pulse, and N is shown as having a value of one. As also shown, in clock periods 7 and 8, the width of the PWM output signal $V_{OUT}$ exceeds the predetermined width of the period of the sampling clock CLK1. Responsively, the analog pulse detect counter 404 de-asserts P SKIP in period 8 and 9 of the sampling clock CLK1 to indicate two skipped pulses, and N is shown as having a value of one in period 8 and two in period 9.

Referring now to FIG. 7A, an example block diagram illustrating an embodiment of the short threshold load lookup table 408 of FIG. 4 is shown. In the embodiment of FIG. 7A, the short threshold load lookup table 408 comprises a 2-dimensional array in which a first index is a number of pulses skipped N, and a second index is a load index L. The number of pulses skipped N is obtained from the analog pulse detect counter 404. The load index L is associated with a load impedance of a load connected to the output pins of the amplifier 22. For example, the different index values may correspond to different impedance values, e.g., 32, 24, 16, or 8 Ohms (as shown). The amplifier 22 detects the load impedance at initialization, as described below (e.g., at block 914 of FIG. 9), and may round the detected impedance up to the nearest impedance level of the short threshold load lookup table 408 to determine the load index L when accessing the short threshold load lookup table 408 (e.g., at block 924 of FIG. 9). Each entry in the table 408, referred to as a STLLTE, is a threshold level associated with the digital input signal $V_{IN}$ (e.g., a power level or voltage level). The threshold levels stored in each of the STLLTE are determined prior to operation of the amplifier 22. For example, the predetermined levels stored in the STLLTE may be determined empirically during design and/or manufacturing of the integrated circuit that includes the amplifier 22 (e.g., IC 9 of FIG. 1) and stored in a non-volatile memory of the integrated circuit. The predetermined level of an entry STLLTE[N][L] may approximate an expected digital input signal $V_{IN}$ that produces the associated number of pulses skipped N when driving the load impedance associated with the load index L during normal operation, i.e., in the absence of a short condition. For example, in the embodiment of FIG. 7A, if the load impedance is 16 Ohms (load index L of 3) and the number of skipped pulses N is two, then the short detect algorithm block 406 will infer the skipped pulses were not generated due to a short condition and instead constitute normal operation if the level of the digital input signal $V_{IN}$ is greater than −3 dBV (e.g., as described below with respect to block 924 of FIG. 9). For another example, if the load impedance is 32 Ohms (load index L of 1) and the number of skipped pulses N is two, then the short detect algorithm block 406 will infer the skipped pulses were generated due to a short condition (as shown), regardless of the level of the digital input signal $V_{IN}$. In one embodiment, the input signal levels in the short threshold load lookup table 408 include a guard band. For example, assume during manufacturing, the load impedance is 16 Ohms and two skipped pulses are observed and it is determined that an expected level of the digital input signal $V_{IN}$ is −1 dBV; in this case, the level associated with the digital input signal $V_{IN}$ may be set to −3 dBV (as shown), rather than −1 dBV, to include a guard band into the algorithm in order to err on the side of not detecting false short conditions. A similar guard band may be built into the values of the table 408 of the embodiment of FIG. 7B below.

Referring now to FIG. 7B, an example block diagram illustrating an alternate embodiment of the short threshold load lookup table 408 of FIG. 4 is shown. In the embodiment of FIG. 7B, the short threshold load lookup table 408 is similar in many respects to the embodiment of FIG. 7A. However, in the embodiment of FIG. 7B, the values of the second index S are associated with an expected level of the input signal $V_{IN}$ rather than the load impedance, and the values in the entries, denoted STLLTE[N][S], are load impedance values rather than levels of the input signal $V_{IN}$. The predetermined load impedance of an entry STLLTE[N][S] may approximate an expected load impedance through which is driven a level of the digital input signal $V_{IN}$ associated with the index S that produces the associated number of pulses skipped N during normal operation, i.e., in the absence of a short condition. For example, in the embodiment of FIG. 7B, if the level of the input signal $V_{IN}$ is −3 dBV (input signal index S of 3) and the number of skipped pulses N is two, then the short detect algorithm block 406 will infer the skipped pulses were not generated due to a short condition and instead constitute normal operation if the connected load impedance (e.g., obtained at block 914 of FIG. 9) is less than 16 Ohms. For another example, if the level of the input signal $V_{IN}$ is −3 dBV (input signal index S of 3) and the number of skipped pulses N is three, then the short detect algorithm block 406 will infer the skipped pulses were generated due to a short condition (as shown), regardless of the connected load impedance.

Referring now to FIG. 8, an example block diagram illustrating an embodiment of the tracking table 412 of FIG. 4 is shown. In the embodiment of FIG. 8, the tracking table 412 comprises a 1-dimensional array in which the index is a number of pulses skipped N. The number of pulses skipped N is obtained from the analog pulse detect counter 404. Each entry in the table 412, referred to as a TTE, is a threshold level associated with the digital input signal $V_{IN}$ similar to the values stored in an STLLTE. However, the levels stored in each of the TTE are dynamically obtained during normal operation of the amplifier 22 when skipped pulses are detected, as described in more detail with respect to FIG. 9. For example, the levels stored in the TTE may be written to a volatile memory of the integrated circuit that includes the amplifier 22 as pulse skips are detected and subsequently read from the volatile memory in response to subsequent detection of pulse skips. Consequently, the TTEs are initialized to indicate they are unpopulated so that the short detect algorithm block 406 may use the short threshold load lookup table 408 instead, as described below with respect to FIG. 9.

Figure 9:
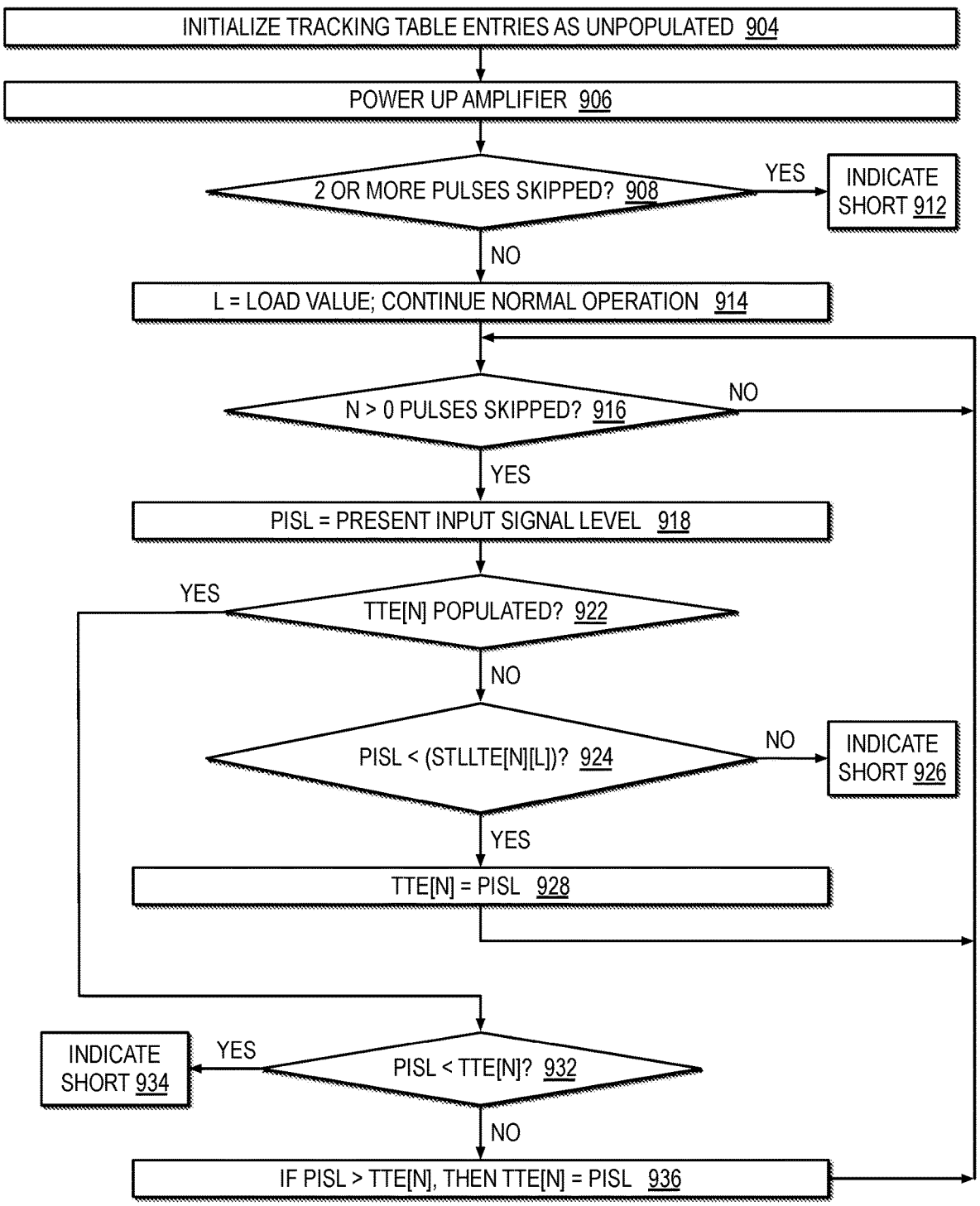
FIG. 9 is an example flow diagram illustrating operation of the D-class amplifier of FIG. 3.

Referring now to FIG. 9, an example flow diagram illustrating operation of the D-class amplifier 22 of FIG. 3 is shown. The operation begins at block 904.

At block 904, the entries of the tracking table 412 are initialized to indicate they are unpopulated. The operation proceeds to block 906.

At block 906, the amplifier 22 is powered up. The operation proceeds to decision block 908.

At decision block 908, the short detect algorithm block 406 determines whether two or more pulses have been skipped, e.g., by examining the PSKIP output of the analog pulse detect counter 404, which may be taken as an indication that a short exists at power on. If so, operation proceeds to block 912; otherwise, operation proceeds to block 914.

At block 912, the short detect algorithm block 406 sets a short detect flag indicating a short of the load. The amplifier 22 may then respond to the setting of the flag by taking actions to avoid damage to the driver stage of the amplifier 22, e.g., power down the driver stage.

At block 914, the impedance value of the load (e.g., headphones), if any, connected to the output pins of the amplifier 22 is obtained, and the load index L associated with the impedance value is stored for subsequent use to index the short threshold load lookup table 408. Once initialization is complete, normal operation proceeds at decision block 916.

At decision block 916, the short detect algorithm block 406 determines whether one or more pulses have been skipped and, if so, saves the number of skipped pulses as N. If so, operation proceeds to block 918; otherwise, operation returns to decision block 916 to await detection of another skipped pulse at the PWM output signal $V_{OUT}$.

At block 918, the present level of the input signal $V_{IN}$, denoted PISL, is obtained and stored. The operation proceeds to decision block 922.

At decision block 922, the short detect algorithm block 406 determines whether the TTE at index N has been populated yet (e.g., at block 928). If so, operation proceeds to decision block 932; otherwise, operation proceeds to decision block 924.

At decision block 924, the short detect algorithm block 406 looks up an entry STLLTE[N][L] in the short threshold load lookup table 408 (e.g., of the embodiment of FIG. 7A) to obtain an expected load impedance value using an index N (obtained at block 916) and an index L based on the attached load impedance (obtained at block 914), e.g., if the attached load impedance is between 16 Ohms and 8 Ohms, then a value of three is selected as the index L, e.g., if the attached load impedance is greater than 32 Ohms, then a value of one is selected as the index L. The short detect algorithm block 406 determines whether the PISL (obtained at block 918) is less than the expected input signal level looked up in the entry of short threshold load lookup table 408 (e.g., in the embodiment of FIG. 7A) at index L (obtained at block 914) and index N (obtained at block 916), denoted STLLTE[N][L]. If so, operation proceeds to block 928; otherwise, operation proceeds to block 926. With respect to the alternate embodiment of FIG. 7B, the short detect algorithm block 406 looks up an entry STLLTE[N][S] in the short threshold load lookup table 408 to obtain an expected load impedance value using an index N (obtained at block 916) and an index S based on the PISL (obtained at block 918), e.g., if the PISL is between −3 dBV and 0 dBV, then a value of three is selected as the index S, e.g., if the PISL is less than −10 dBV, then a value of one is selected as the index S. The short detect algorithm block 406 determines whether the attached load impedance value obtained at block 914 is greater than the expected load impedance value looked up in the short threshold load lookup table 408. If so, operation proceeds to block 928; otherwise, operation proceeds to block 926. Thus, with respect to both the embodiment of FIGS. 7A and 7B, at block 924 the short detect algorithm block 406 effectively performs a comparison of the level of the present input signal $V_{IN}$ to an expected level that is predetermined based on an amount the PWM output signal $V_{OUT}$ exceeds the sample clock period and on the impedance of the load connected to the output pins of the amplifier 22. It should be recalled from the description of FIG. 7A that guard bands may be built into the values of the short threshold load lookup tables 408, and other embodiments are contemplated in which the guard bands are built into any or a combination of the various array indexes and entry values.

At block 926, the short detect algorithm block 406 sets the short detect flag indicating a short of the load. The amplifier 22 may then respond to the setting of the flag by taking actions to avoid damage to the driver stage of the amplifier 22, e.g., power down the driver stage.

At block 928, the digital tracking block 402 updates the TTE[N] with the PISL. In this manner, as the amplifier 22 operates normally, the amplifier 22 effectively learns more accurate expected levels of the input signal $V_{IN}$ associated with different numbers of skipped pulses for the currently connected load impedance than the expected levels represented in the short threshold load lookup table 408. More specifically, as the levels of the input signal $V_{IN}$ rise high enough to cause skipped pulses, the tracking table 412 is populated over time with digital input signal $V_{IN}$ level values that may be compared with subsequent PISL to determine whether a short condition has occurred. Generally speaking, the dynamic threshold level values of the tracking table 412 may be more accurate for the instance of the amplifier 22 than the predetermined threshold level values of the short threshold load lookup table 408 since the values of the tracking table 412 are dynamically gathered during normal operation of the instance of the amplifier 22, which may be different than a different instance of amplifier 22 design used to obtain the empirical values of the short threshold load lookup table 408. The predetermined levels of the short threshold load lookup table 408 may be conceptualized as more coarse-gained expected levels than the more fine-grained expected levels of the tracking table 412. Stated alternatively, the short threshold load lookup table 408 may be employed as a static fallback mechanism employed to differentiate a normal/non-short condition from a true short condition until the amplifier 22 has operated long enough to populate the dynamic levels of the tracking table 412 which may then be used to differentiate a normal/non-short condition from a true short condition. The operation returns to decision block 916 to wait for detection of a subsequent pulse skip at the PWM output signal $V_{OUT}$.

At decision block 932, the short detect algorithm block 406 determines whether the PISL (obtained at block 918) is less than the entry of tracking table 412 at index N, denoted TTE[N]. If so, operation proceeds to block 934; otherwise, operation proceeds to block 936. In one embodiment, a guard band may be similarly employed in the comparison of decision block 932, although preferably the guard band of decision block 932 may be smaller than the guard band of decision block 924.

At block 934, the short detect algorithm block 406 sets the short detect flag indicating a short of the load. The amplifier 22 may then respond to the setting of the flag by taking actions to avoid damage to the driver stage of the amplifier 22, e.g., power down the driver stage.

At block 936, if the PISL is greater than the TTE[N], then the short detect algorithm block 406 updates the TTE[N] with the PISL. The operation returns to decision block 916 to wait for detection of a subsequent pulse skip at the PWM output signal $V_{OUT}$.

Although embodiments have been described in which the load is a headphone, it should be understood that other loads may be connected to the output pins of the amplifier 22, e.g., a speaker.

The description above sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element. Further embodiments likewise, with the benefit of this disclosure, will be apparent to those having ordinary skill in the art, and such embodiments should be deemed as being encompassed herein.

The invention claimed is:

1. An apparatus for detecting a short at an output of a class-D amplifier, the apparatus comprising:
   a pulse detector that detects that a pulse-width modulation (PWM) pulse of the output exceeds a predetermined width;
   a controller configured to differentiate whether the PWM pulse exceeding the predetermined width is caused by a short at the output or by a large digital input signal occurring during normal operation of the class-D amplifier; and
   wherein the controller differentiates based on an expected level of the digital input signal and a level of the digital input signal when the PWM pulse is detected to exceed the predetermined width.

2. The apparatus of claim 1,
   wherein the controller comprises a digital tracking block that dynamically obtains the expected level of the digital input signal in response to one or more previous PWM pulses exceeding the predetermined width during the normal operation of the amplifier.

3. The apparatus of claim 2,
   wherein if the expected level of the digital input signal has not yet been dynamically obtained when the PWM pulse exceeds the predetermined width, then the expected level of the digital input signal is a predetermined level.

4. The apparatus of claim 3,
   wherein the controller is further configured to determine an impedance value of a load connected to the output; and
   wherein the predetermined level is based on the impedance value of the load.

5. The apparatus of claim 4,
   wherein the expected level of the digital input signal is based on an amount the PWM pulse exceeds the predetermined width.

6. The apparatus of claim 5,
   wherein the amount the PWM pulse exceeds the predetermined width is measured relative to a sampling clock period.

7. The apparatus of claim 1,
   wherein the controller is further configured to detect a short at the output if, immediately after the class-D amplifier is powered up, the PWM pulse exceeds at least twice the predetermined width.

8. A method for detecting a short at an output of a class-D amplifier, comprising:
   detecting that a pulse-width modulation (PWM) pulse of the output exceeds a predetermined width;
   differentiating whether the PWM pulse exceeding the predetermined width is caused by a short at the output or by a large digital input signal occurring during normal operation of the class-D amplifier; and
   wherein said differentiating is based on an expected level of the digital input signal and a level of the digital input signal when the PWM pulse is detected to exceed the predetermined width.

9. The method of claim 8,
   wherein the expected level of the digital input signal is dynamically obtained in response to one or more previous PWM pulses exceeding the predetermined width during the normal operation of the amplifier.

10. The method of claim 9,
    wherein if the expected level of the digital input signal has not yet been dynamically obtained when the exceeding is determined, then the expected level of the digital input signal is a predetermined level.

11. The method of claim 10, further comprising:
    determining an impedance value of a load connected to the output; and
    wherein the predetermined level is based on the impedance value of the load.

12. The method of claim 11,
    wherein the expected level of the digital input signal is based on an amount the PWM pulse exceeds the predetermined width.

13. The method of claim 12,
    wherein the amount the PWM pulse exceeds the predetermined width is measured relative to a sampling clock period.

14. The method of claim 8, further comprising:
  detecting a short at the output if, immediately after the class-D amplifier is powered up, the PWM pulse exceeds at least twice the predetermined width.

15. A non-transitory computer-readable medium having instructions stored thereon that are capable of causing or configuring an apparatus for detecting a short at an output of a class-D amplifier to perform operations comprising:
  detecting that a pulse-width modulation (PWM) pulse of the output exceeds a predetermined width;
  differentiating whether the PWM pulse exceeding the predetermined width is caused by a short at the output or by a large digital input signal occurring during normal operation of the class-D amplifier; and
  wherein said differentiating is based on an expected level of the digital input signal and a level of the digital input signal when the PWM pulse is detected to exceed the predetermined width.

16. The non-transitory computer-readable medium of claim 15,
  wherein the expected level of the digital input signal is dynamically obtained in response to one or more previous PWM pulses exceeding the predetermined width during the normal operation of the amplifier.

17. The non-transitory computer-readable medium of claim 16,
  wherein if the expected level of the digital input signal has not yet been dynamically obtained when the exceeding is determined, then the expected level of the digital input signal is a predetermined level.

18. The non-transitory computer-readable medium of claim 17, further comprising:
  determining an impedance value of a load connected to the output; and
  wherein the predetermined level is based on the impedance value of the load.

19. The non-transitory computer-readable medium of claim 18,
  wherein the expected level of the digital input signal is based on an amount the PWM pulse exceeds the predetermined width.

20. The non-transitory computer-readable medium of claim 19,
  wherein the amount the PWM pulse exceeds the predetermined width is measured relative to a sampling clock period.

* * * * *